United States Patent
Jain et al.

(10) Patent No.: US 8,782,580 B2
(45) Date of Patent: Jul. 15, 2014

(54) EXECUTING A HARDWARE SIMULATION AND VERIFICATION SOLUTION

(71) Applicant: Synopsys, Inc., Mountain View, CA (US)

(72) Inventors: Manish Jain, San Jose, CA (US); Subha S. Chowdhury, Kolkata (IN); Sridhar Seshadri, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/685,412

(22) Filed: Nov. 26, 2012

(65) Prior Publication Data
US 2013/0085738 A1    Apr. 4, 2013

Related U.S. Application Data

(62) Division of application No. 13/359,386, filed on Jan. 26, 2012, now Pat. No. 8,341,570, which is a division of application No. 12/112,222, filed on Apr. 30, 2008, now Pat. No. 8,121,825.

(51) Int. Cl.
*G06F 17/50* (2006.01)

(52) U.S. Cl.
USPC ........................................................ 716/106

(58) Field of Classification Search
USPC ........................................... 716/106; 703/14
See application file for complete search history.

(56) References Cited

U.S. PATENT DOCUMENTS

| | | | |
|---|---|---|---|
| 6,087,967 A | 7/2000 | Budnik et al. | |
| 6,691,301 B2 | 2/2004 | Bowen | |
| 7,408,336 B2 | 8/2008 | Birmiwal et al. | |
| 7,480,606 B2 | 1/2009 | Tseng et al. | |
| 7,827,541 B2 | 11/2010 | Chen et al. | |
| 2002/0002698 A1* | 1/2002 | Hekmatpour | 716/4 |
| 2004/0154002 A1 | 8/2004 | Ball | |
| 2004/0243371 A1* | 12/2004 | Gutkovich et al. | 703/14 |
| 2004/0243372 A1 | 12/2004 | Tester | |
| 2004/0249623 A1 | 12/2004 | Selvidge | |
| 2006/0004557 A1 | 1/2006 | Maturana et al. | |
| 2006/0195825 A1* | 8/2006 | Vanspauwen et al. | 717/135 |

OTHER PUBLICATIONS

Koch, Michael et al., "Distributed VHDL Simulation within a Workstation Cluster", Proceedings of the 27th Annual Hawaii International Conference on System Sciences, 1994, pp. 313-322.

Naroska, Edwin et al., "A Novel Approach for Digital Waveform Compression", pp. 712-715, XP-002546840, IEEE 2003.

(Continued)

*Primary Examiner* — Vuthe Siek
(74) *Attorney, Agent, or Firm* — Park, Vaughan, Fleming & Dowler LLP; Laxman Sahasrabuddhe

(57) ABSTRACT

One embodiment of the present invention provides systems and techniques to execute a hardware simulation and verification solution on a multiprocessor system. The hardware simulation and verification solution can be partitioned into different modules which can include a simulation kernel to simulate changes in signal values, a value change dump module to store the changes in the signal values on a computer-readable storage medium, a functional coverage module to check functionality, a toggle coverage module to check signal toggling, an assertion engine to check complex behaviors, and a testbench module to generate test scenarios. Embodiments of the present invention can execute different modules on different processors, thereby improving performance.

12 Claims, 7 Drawing Sheets

(56) References Cited

OTHER PUBLICATIONS

Dawson, Charles et al., "The Verilog Procedural Interface for the Verilog Hardware Description Language", pp. 17-23, IEEE 1996.

Marantz, Joshua, "Enhanced Visibility and Performance in Functional Verification by Reconstruction", pp. 164-169, 1998.

Martinolle et al, "A Procedural Language Interface for VHDL and its Typical Applications", Verilog HDL Conference and VHDL International Users Forum, 1998.

Jou et al, "Coverage Analysis Techniques for HDL Design Validation", 6th Asia Pacific Conference on Chip Design Languages 1999.

Shields, John, "Modeling Foreign Architectures with VHPI", Proceedings of the VHDL International Users Forum Fall Workshop, 2000.

Sutherland, Stewart, "The Verilog PLI Handbook, A User's Guide and Comprehensive Reference on the Verilog Programming Interface", Second Edition, Kluwer Academic Publishers, 2002, pp. i-xxiii; 197-269.

* cited by examiner

EXECUTING A HARDWARE SIMULATION AND VERIFICATION SOLUTION

RELATED APPLICATION

This application is a divisional of, and claims priority to, U.S. patent application Ser. No. 13/359,386, entitled "Method and Apparatus for Executing a Hardware Simulation and Verification Solution," by the same inventors as the instant application, filed on 26 Jan. 2012, the contents of which are herein incorporated by reference. U.S. patent application Ser. No. 13/359,386 is a divisional of, and claims priority to, U.S. patent application Ser. No. 12/112,222, filed on 30 Apr. 2008, issued on 21 Feb. 2012 as U.S. Pat. No. 8,121,825, the contents of which are herein incorporated by reference.

BACKGROUND

1. Field of the Invention

The present invention generally relates to hardware design and verification. More specifically, the present invention relates to methods and apparatuses for executing a hardware simulation and verification solution.

2. Related Art

Rapid advances in computing technologies have been made possible by advances in design and verification tools because without such tools it would have been almost impossible to design and verify complicated integrated circuits which are commonly found in today's computing devices. Due to the rapidly increasing size and complexity of integrated circuits, there is a strong need to find methods and apparatuses to improve the performance of hardware simulation and verification solutions.

Unfortunately, conventional techniques for improving software performance are not always effective. For example, rewriting the software from scratch so that it can be executed in parallel is impractical due to the enormous costs of rewriting such a complex piece of software. A parallelizing compiler may also fail to improve performance because even the most sophisticated parallelizing compilers often fail to exploit parallelization opportunities in such complex pieces of software. Further, parallelizing only a small portion of the software usually does not substantially improve performance due to Amdahl's law, and partitioning the software into different pieces may degrade performance if the different pieces require large amounts of synchronization.

SUMMARY

One embodiment of the present invention provides systems and techniques to execute a hardware simulation and verification solution on a multiprocessor system. Specifically, an embodiment partitions the hardware simulation and verification solution into different modules so that they can be executed in parallel without requiring a substantial amount of communication or synchronization between the modules.

A hardware simulation and verification solution can be partitioned into a simulation kernel to simulate changes in signal values, a value change dump (VCD) module to store the changes in the signal values on a computer-readable storage medium, a functional coverage module to check functionality, a toggle coverage module to check signal toggling, an assertion engine to check complex behaviors, and a testbench module to generate test scenarios. Embodiments of the present invention can execute different modules on different processors, thereby improving performance.

DETAILED DESCRIPTION

Integrated Circuit (IC) Design Flow

Figure 1:
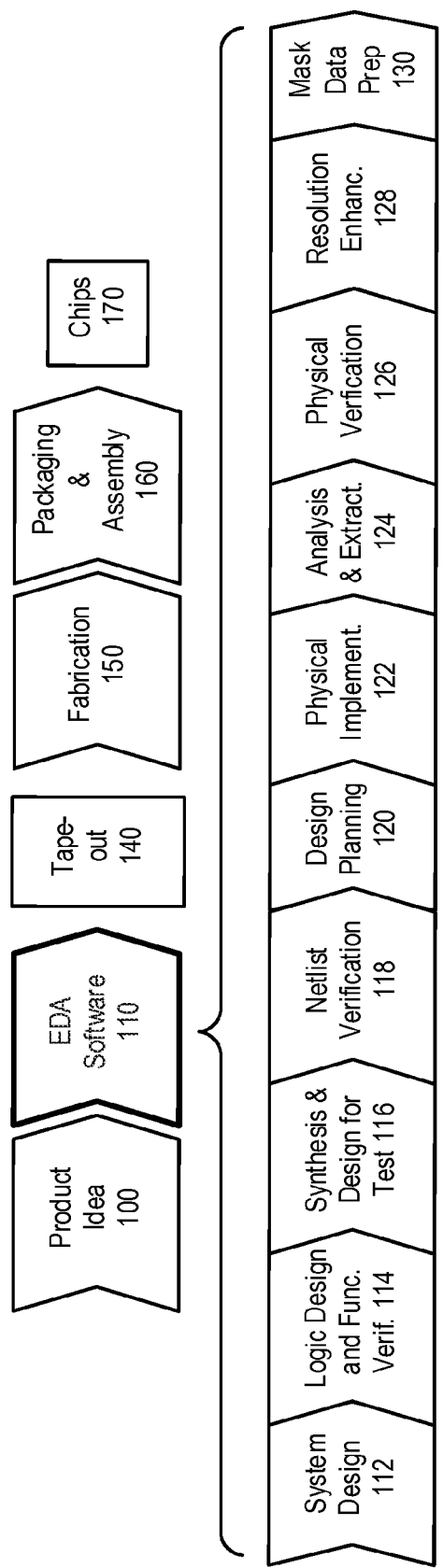
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process usually starts with a product idea (step 100) which is realized using an EDA software design process (step 110). Once the design is finalized, it is usually taped-out (event 140) and goes through the fabrication process (step 150) and packaging and assembly processes (step 160) to produce the finished chips (result 170).

The EDA software design process (step 110) comprises steps 112-130, which are described below for illustration purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda® products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level, this in turn permits what-if refinement.

Exemplary EDA software products from Synopsys, Inc. that can be used at this step include AstroRail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the logic design and functional verification step 114.

Simulation and Verification Solution

The introduction of HDLs (hardware description languages) revolutionized hardware verification, and by the early 1990s, HDL based simulators had already become an important tool in hardware verification. Since its introduction, HDL simulator performance continued to improve, and verification technologies went through a phase in which a number of "bolt-on" tools were developed to improve verification capabilities.

However, the bolt-on tools approach reduced the overall performance of the simulation and verification solution because it resulted in a costly and fragmented solution which was a mishmash of multiple methodologies and vendors. Each bolt-on tool compiled or interpreted its own language independently, which created inefficiencies during the analysis or compilation phase and also led to inconsistencies between the tools because of the differences in the interpretation of certain hardware constructs in the design. As semiconductor integration densities continued to increase rapidly, it became clear that there was a need for a unified, comprehensive solution for hardware simulation and verification. In response to this need, Synopsys introduced VCS® which is a comprehensive hardware simulation and verification solution.

Figure 2:
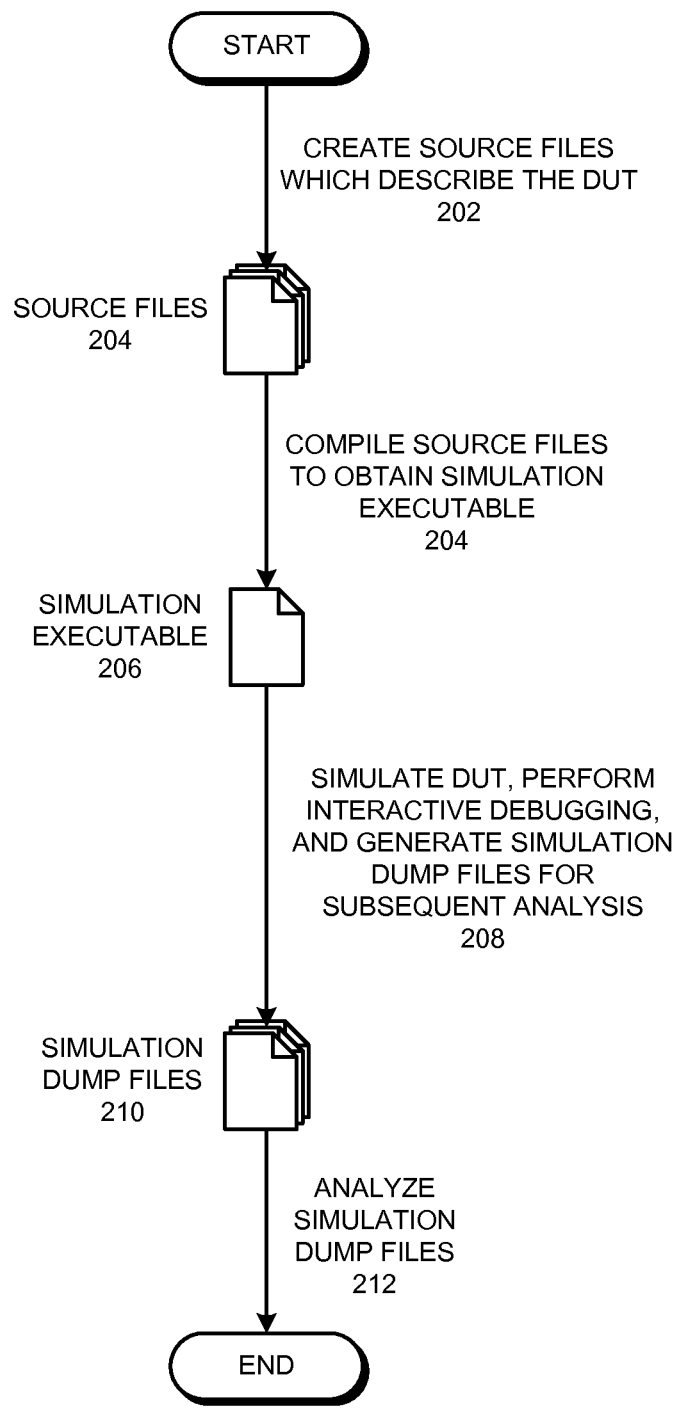
FIG. 2 illustrates a workflow for a simulation and verification solution in accordance with an embodiment of the present invention.

FIG. 2 illustrates a workflow for a simulation and verification solution in accordance with an embodiment of the present invention.

The process typically begins by creating source files 204 that describe the design under test (DUT) (step 202). Source files 204 may describe the DUT using a standardized, non-proprietary hardware description language.

Next, a compiler is used to compile the source files to obtain a simulation executable 206 (step 204). Simulation executable 206 can be a software application which when executed simulates the behavior of the DUT. The simulation executable can also include instructions to perform verification of the DUT during simulation. For example, the compiler can be configured so that it generates instructions for checking the functionality of different parts of the DUT during simulation. Similarly, the compiler can be configured so that it generates instructions that check how many times a set of user-specified signals toggled during simulation.

The simulation executable can then be executed to simulate the DUT, perform interactive debugging, and generate simulation dump files 210 for subsequent analysis (step 208). Simulation dump files 210 typically contain information about how signal values changed during simulation. One embodiment of the present invention uses compression techniques to reduce the size of the simulation dump files. Next, the simulation dump files can be analyzed (step 212) to debug the DUT.

The workflow shown in FIG. 2 is for illustrative purposes and it not intended to limit the scope of the present invention. For example, interpretive simulators typically do not need a compilation step in their workflow. However, a compiler-based approach usually simulates faster and uses less memory than an interpreter-based approach because a compiler-based approach avoids the extra layers and inefficiency of an interpreter-based approach. Further, the time required to compile source files can be reduced substantially by using incremental compilation which reuses compiled modules unless the associated source files were updated since the last compilation.

Although comprehensive simulation and verification solutions represented a significant improvement over the earlier bolt-on approaches, there is once again a need to find methods and apparatuses to improve the performance of hardware simulation and verification solutions because of the rapidly increasing size and complexity of integrated circuits.

Until recently, microprocessor vendors have been able to increase performance by increasing clock speeds. However, as semiconductor densities continue to increase, it is becoming increasingly difficult to increase clock speeds due to physical limitations such as heat dissipation and synchronization. Hence, the computer industry is exploring other avenues, such as parallel processing, for increasing application performance. Specifically, microprocessor vendors have introduced multi-core processors which include multiple processors in a single chip.

Multiprocessor System

Figure 3:
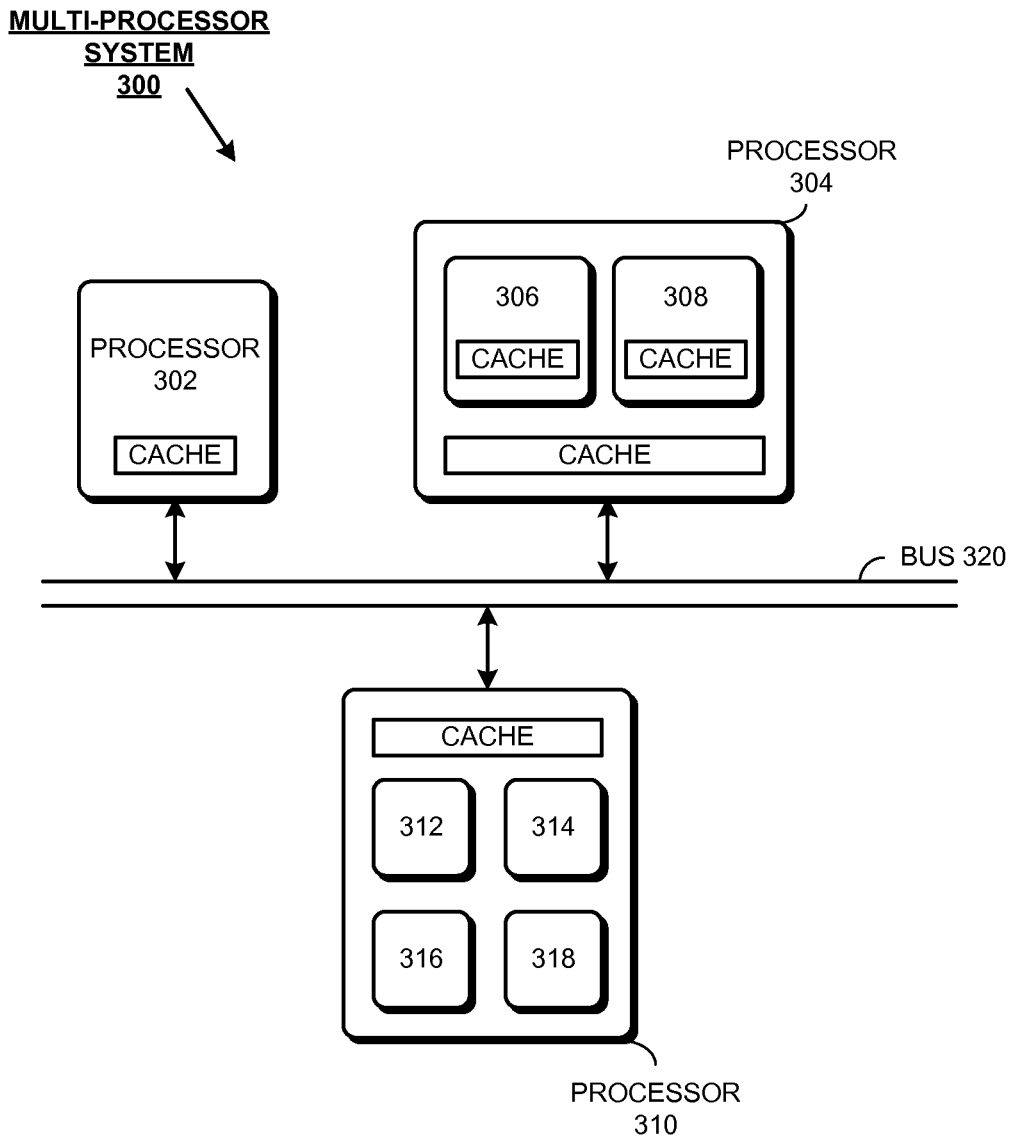
FIG. 3 illustrates a multiprocessor system in accordance with an embodiment of the present invention.

FIG. 3 illustrates a multiprocessor system in accordance with an embodiment of the present invention.

A multiprocessor system can include multiple processors which may be coupled using a bus or a switch. A processor can generally be any circuit that can execute instructions thereby causing the circuit to perform operations on data stored in a computer-readable storage medium. For example, multiprocessor system 300 includes processors 302, 304, and 310 which are coupled using bus 320.

A processor can include one or more cores, wherein each core is essentially a processor, i.e., it is a circuit that is capable of executing instructions. For example, processor 302 includes one core, processor 304 includes two cores (cores 306 and 308), and processor 310 includes four cores (cores 312, 314, 316, and 318). Hereinafter, the terms "processor" and "core" are used interchangeably.

In addition to having one or more cores, a processor can include one or more levels of cache. For example, processor 302 uses a single level cache, whereas processor 304 uses two levels of caches. Specifically, each core in processor 304 has its own L1 (level 1) cache, and these cores share an L2 (level 2) cache. A processor may include separate instruction and data caches, or it may include a single cache that stores both instructions and data.

Communication between the processors can be achieved using a number of techniques. In shared-memory architectures, multiple processors can access the same address space. Hence, a first processor can store data in a shared-memory location, and a second processor can read the data from the shared-memory location. In other types of architectures, processors can communicate with each other by sending messages or packets over a bus or a switch. For example, a first processor can store data in a packet and send it to a second processor, which can then use the data to perform further processing.

There are a number of techniques for designing software for multiprocessor systems. An application can be written in a concurrent programming language which allows an application developer to explicitly specify which steps are to be performed in parallel. However, due to the enormous cost associated with re-writing large software applications, this option is often impractical. Another option is to use a parallelizing compiler which can automatically detect sequences of instruction that can be executed in parallel. However, even the most sophisticated parallelizing compilers often fail to exploit parallelization opportunities in complex software applications.

Yet another option is to partition a software application into different components or modules which can be executed in parallel without requiring a large amount of communication between the modules. Application level partitioning can be very challenging since it requires a software developer to have a deep understanding of the inner workings of the software application. Even after the software developer gains a deep understanding, the developer still has to find a way to partition the software so that executing them in parallel will improve performance. Specifically, if the software is partitioned into components which require a large amount of synchronization between them, it may actually degrade performance because of communication bottlenecks. Additionally, the partitioning solution must be fairly easy to implement, i.e., it should be cost effective to modify the sequential software code so that it can be executed on a multiprocessor system.

Embodiments of the present invention are based on novel insights of how a hardware simulation and verification solution (which is a very complex piece of software) can be partitioned into different modules in a cost effective manner so that these modules can be executed in parallel without requiring a substantial amount of synchronization or communication between the modules.

Simulation Kernel

The simulation kernel is usually the part of the simulation and verification solution which, among other tasks, schedules simulation events in an event queue, advances the simulation time, and processes scheduled events as simulation time progresses. Note that these tasks are not intended to be exhaustive or to limit the simulation kernel to the tasks disclosed. In one embodiment, parts of the simulation kernel can be stored in a software library. During compilation, the system can link the library with other code to create the simulation kernel.

The simulation kernel can expose a callback interface which can be used to install callback functions. A callback function can be invoked when an associated event occurs or when the simulation is in a particular event region in a time slot.

In one embodiment, the system can execute the simulation kernel on a single processor. In this embodiment, the signal values in the entire DUT are determined by the simulation kernel which is executing on the processor. In another embodiment, different parts of the DUT can be simulated on different processors. Note that this embodiment may require a substantial amount of communication and synchronization between the different processors because signal changes in one part of the DUT are likely to affect the signal values in another part of the DUT.

Figure 4:
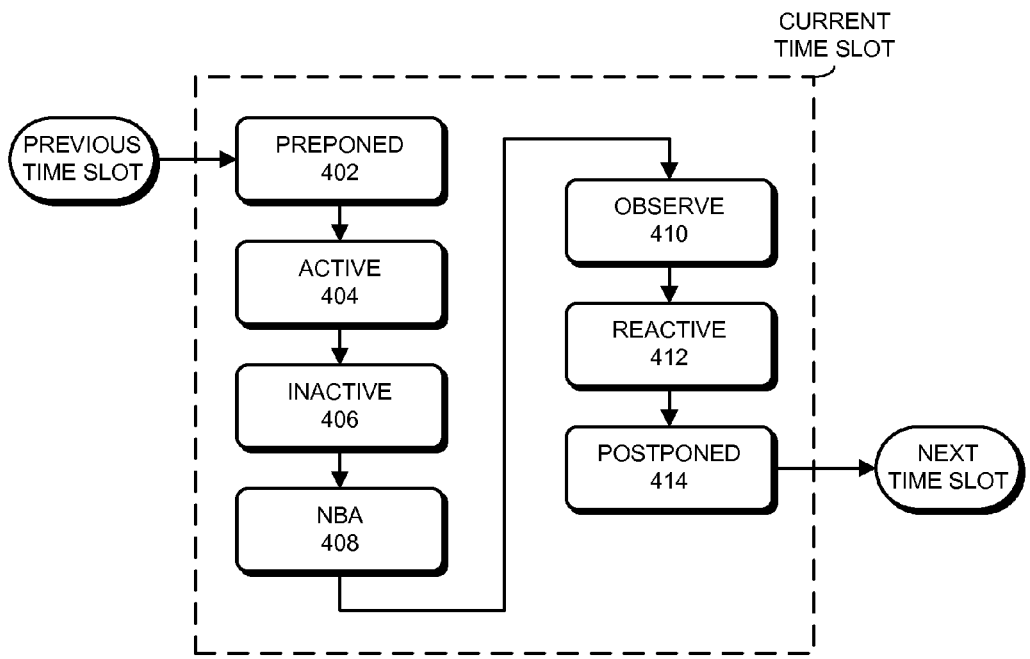
FIG. 4 presents a diagram which illustrates different event regions in a time slot in accordance with an embodiment of the present invention.

FIG. 4 presents a diagram which illustrates different event regions in a time slot in accordance with an embodiment of the present invention.

The time slot can be divided into a set of ordered regions, and each region can be used for processing certain types of simulation events. Dividing a time slot into regions can ensure that a set of simulation events that are associated with a particular region are guaranteed to be processed before (or after) another set of events which are associated with another region. However, the order in which the events are executed in any given region may not be specified by the semantics of the HDL. Alternatively, the HDL may include constructs which enable a user to specify the order of the events within a region.

In one embodiment, a time slot can include preponed region 402, active region 404, inactive region 406, NBA (non-blocking assignment) region 408, observe region 410, reactive region 412, and postponed region 414. Preponed region 402 occurs before changes in signal values are simulated for the current timeslot. Hence, preponed region 402 can be used to install callback functions that need to access simulation data before variables change state and before processes are executed for the current timeslot. Preponed region 402 can also be used to sample steady-state data. Active region 404, inactive region 406, NBA region 408, observe region 410, and reactive region 412 are known as iterative regions. Postponed region 414 occurs after all the changes in signal values have been simulated for the current timeslot. Hence, postponed region 414 can be used to install callback functions that need to access simulation data after all variables have changed state and after all processes have been executed for the current timeslot.

The DUT's description typically includes modules which describe the functionality of a part of the DUT, e.g., a component or a circuit. Active region 404 is used to determine signal values by executing the modules in the DUT's description. Inactive region 406 is used to perform any HDL code that could not be executed in the active region due to race conditions. It may be possible to eliminate the need for inactive region 406 if the HDL code is written according to certain coding principles.

NBA region 408 can be used to efficiently handle simulation race conditions. Specifically, events in NBA region 408 are processed after all design clock signals have propagated and clock triggered processes have executed, but before the simulation time advances. Observe region 410 is where invariant assertions may be evaluated, and this region comes after NBA region 408 because non-blocking assertions in NBA region 408 can change variable values. Observe region 410 is also the last region in which clocked assertions may be evaluated.

Testbench code is used to generate stimulus for the DUT, and to check results to verify that the design conforms to specifications. Reactive region 412 can be used to execute testbench code, including the pass/fail statements of assertions.

Value Chance Dump

Simulation and verification solutions often dump signal value changes in a file for subsequent analysis. For example, in the workflow shown in FIG. 2, the system generates simulation dump files 210 to perform subsequent analysis. Since the number of signal value changes can be quite large, some simulation and verification solutions employ compression techniques to reduce the size of the dump files. Unfortunately, compressing the value change data can require a large amount of computation, which can reduce simulation performance.

Note that compression can be performed independently of the simulation itself because compressing value change data doesn't change any signal states in the DUT. One embodiment of the present invention uses this insight to execute the simulation kernel and the compression of the value change data in parallel. Specifically, a callback function can be installed in the simulation kernel to collect signal value changes and to store the value change data in shared memory. Next, a value change dump module can be executed on another processor to compress the value change data, and to store the compressed data for subsequent analysis.

Functional Coverage

Functional coverage can be used to measure the progress of the verification effort. In one approach, the system can use a functional coverage model to define how to measure progress of the verification effort. A functional coverage model usually includes functional coverage objects which represent conditions for satisfying the verification plan.

In a constrained-random testing approach, the stimulus can be instrumented with functional coverage. The random stimulus can be measured to determine if all important input conditions occur in the test suite as well as in the design. Functional coverage can be collected for all verification tests specified in the functional-coverage model, and a functional-coverage metric can be determined based on the test data. The functional-coverage metric can help an engineer to determine what, if any, additional tests, random or possibly directed, are needed. The functional-coverage objects can be used to determine a functional-coverage metric which can indicate the progress of the verification effort.

In one embodiment, the functional coverage model can be described in a language which allows a user to specify behaviors, and the function coverage module can keep track of the number of times a behavior occur. Specifically, a coverage model can include a set of coverage groups, wherein each coverage group can include sampling events and coverage expressions. A sampling event can generally be any simulation event, e.g., a signal or variable change. A coverage expression can specify the values of interests for the sampled variables, illegal values, and ignored values. Values of interest can be used to specify the desired behavior, illegal values can be used to identify bugs in the DUT, and ignored values can be used to define states which are not collected and/or which are ignored while determining the functional coverage metric. The functional coverage model can also specify crosses of sampled variables of a coverage group, which can enable the functional coverage module to correlate between multiple coverage items.

Note that the functional coverage computations can be performed more or less independently of the hardware simulation because determining functional coverage doesn't change signal states in the DUT. One embodiment of the present invention uses this insight to execute the simulation kernel and the functional coverage module in parallel. Specifically, a callback function can be installed in the simulation kernel to collect signal value changes and to store the value change data in shared memory. Next, a functional coverage module can be executed on another processor to determine a functional coverage metric and to report the metric to a user.

Toggle Coverage

Coverage metrics can be divided into two categories based on the type of information they provide. A control-flow-coverage metric indicates the extent of control-flow coverage that has been performed, i.e., the extent to which lines, paths, and branches in the DUT were taken during simulation. The value-coverage metric indicates the extent of value coverage that has been performed, i.e., the extent to which signal values during simulation matched the expected signal values.

A toggle-coverage metric is a value-coverage metric that tracks whether signal lines within the DUT are toggling or not. Toggle coverage is typically used to ensure that a signal line in the DUT is "alive," i.e., the signal line is changing its value during simulation.

A toggle coverage model can specify which signal lines are to be monitored and how one or more toggle-coverage metrics are to be computed based on the test data. For example, a toggle coverage model can include all signal lines in a bus, and the associated toggle-coverage metric can report the percentage of signal lines in the bus that toggled at least once during simulation. Alternatively, a toggle-coverage metric can report the average number of times a signal line toggled during simulation. These examples of toggle-coverage models and metrics have been presented for illustration purposes and are not intended to be exhaustive or to restrict the present invention to the forms disclosed.

Note that the toggle coverage computations can be performed more or less independently of the hardware simulation because determining toggle coverage doesn't change signal states in the DUT. One embodiment of the present invention uses this insight to execute the simulation kernel and the toggle coverage module in parallel. Specifically, a callback function can be installed in the simulation kernel to collect signal value changes and to store the value change data in shared memory. Next, a toggle coverage module can be executed on another processor to determine a toggle coverage metric and to report the metric to a user.

Assertions

Assertions are statements about design elements, e.g., signals, registers, transactions, etc. which are supposed to evaluate to true if the DUT is functioning properly. Checking an assertion can require access to these design elements on a cycle-by-cycle basis. Hence, to speed up simulation throughput, it may be preferable to minimize the overhead for accessing design elements during simulation. Specifically, attempting to access design elements through an application interface (e.g., by installing a callback function) may substantially degrade performance, and hence, it may be preferable to support assertions within the simulation kernel.

In conventional approaches, assertions are typically evaluated in the observe region 410 shown in FIG. 4. However, note that assertions typically use signal values that were determined in previous time slots. Hence, it may be possible to evaluate assertions at the beginning of a time slot. One embodiment of the present invention exploits this insight to evaluate assertions in a separate thread. Specifically, the simulation kernel can be executed on a first thread which executes on a first core, and an assertion engine can be executed on a second thread which executes on a second core. The simulation kernel can notify the assertion engine that a new time slot has begun. In response to receiving the notification, the assertion engine can evaluate assertions using signal values that were determined in previous time slots.

Since the assertion engine uses signal values that were determined in previous time slots, the assertion can be executed in parallel with the simulation kernel. Further, note that a very small amount of synchronization may be required between the assertion engine thread and the simulation kernel thread because it may be sufficient to synchronize the threads at the beginning and/or at the end of a time slot.

Testbench

A testbench module is typically used to generate stimulus for the DUT, and to check results to verify that the design conforms to specifications. A testbench can include multiple models, which may be written at different levels of abstraction, and which may sometimes require close synchronization. The testbench models are typically described in a language that enables a user to specify how to generate test scenarios. If the simulation kernel and the testbench require close synchronization, it may not be beneficial to execute them in parallel. However, it may be possible to minimize the amount of synchronization required by following certain coding restrictions. One embodiment of the present invention uses this insight to create testbench models that can be executed in parallel with the simulation kernel.

Specifically, the coding restrictions for the testbench model can include the following: (1) the design signals should be sampled with a non-zero skew, (2) hierarchical references should not be present between the testbench code and the simulation kernel code, (3) asynchronous sampling and event-controls should not be used, and (4) variables should not be shared between the testbench code and the simulation kernel code. If these coding restrictions are observed, the simulation kernel and the testbench module can most likely be executed in parallel without requiring a substantial amount of synchronization between the two.

In one embodiment, the simulation kernel and the testbench module have their own event driven schedulers which execute more or less independently of each other. The testbench output events can be propagated to the simulation kernel at the end of the reactive regions in a time slot. Since events scheduled in the NBA region in the testbench correspond to assignments to design signals only, they can be handled by the simulation kernel after all other events in the reactive region have been processed. Note that this scheme is backward compatible since it maintains the usual semantics of propagation of events from the testbench module to the simulation kernel. Further, note that it may be sufficient to synchronize the simulation kernel and the testbench module only once per time slot.

Process For Executing a Simulation and Verification Solution

Figure 5:
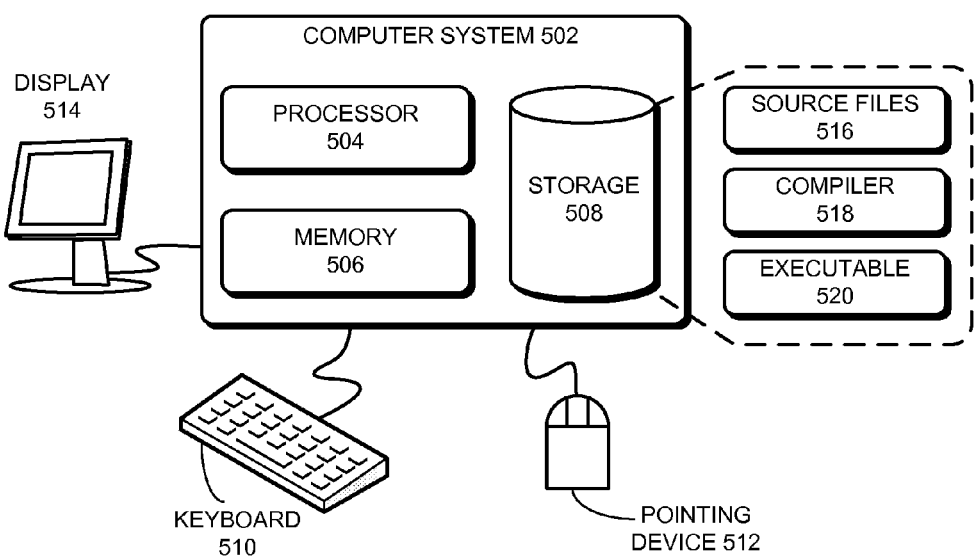
FIG. 5 illustrates a computer system which can be used to execute a simulation and verification system in accordance with an embodiment of the present invention.

FIG. 5 illustrates a computer system which can be used to execute a simulation and verification system in accordance with an embodiment of the present invention.

Computer system 502 comprises processor 504, memory 506, and storage device 508. Computer system 502 can be coupled to display 514, keyboard 510, and pointing device 512. Storage device 508 can store source files 516, compiler 518, and executable 520. Processor 504 can include one or more cores, and/or computer system 502 can include a multiprocessor system.

During operation, computer system 502 can load compiler 518 into memory 506. Next, a user can use compiler 518 to compile source files 516 to generate executable 520. Executable 520 can include one or more files, and can be stored on a computer-readable storage medium, such as storage device 508. Computer system 502 can load executable 520 into memory 506 and execute instructions stored in executable 520 using processor 504. In one embodiment, executable 520 can include instructions for a simulation kernel, a value change dump module, a functional coverage module, a toggle coverage module, an assertion engine, and a testbench module.

In conventional techniques, a hardware and verification solution is typically executed as a single process on a single processor. As a result, convention techniques for improving performance of a hardware simulation and verification solution have focused on code optimization. In contrast, embodiments of the present invention improve performance by partitioning the hardware simulation and verification solution into different components and executing the different components as separate processes or threads on a multiprocessor system.

Figure 6:
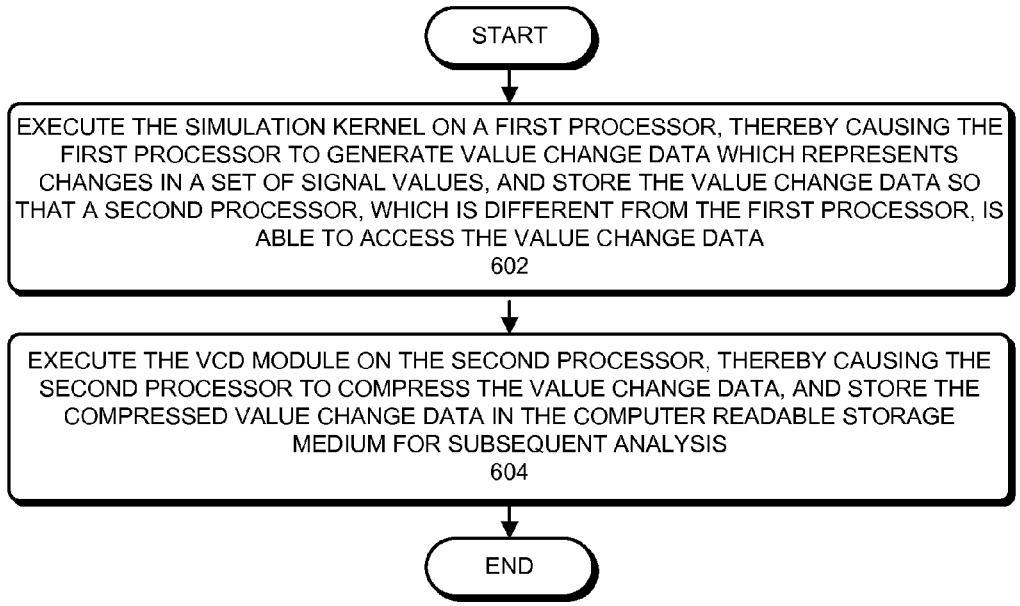
FIG. 6 presents a flowchart that illustrates a process for executing a hardware simulation and verification solution on multiple processors which includes a simulation kernel and a value change dump module in accordance with an embodiment of the present invention.

FIG. 6 presents a flowchart that illustrates a process for executing a hardware simulation and verification solution on multiple processors which includes a simulation kernel to simulate changes in signal values, and a VCD module to store the changes in the signal values on a computer-readable storage medium in accordance with an embodiment of the present invention.

During operation, the system can receive source files which describe a DUT using a standardized, non-proprietary HDL. Next, the system can compile the source files to obtain the simulation kernel. Alternatively, the system can receive a pre-compiled simulation kernel.

In one embodiment, the simulation kernel can expose a callback interface which is used to install callback functions which are invoked when specific events occur. During compilation, a callback function can be installed which is invoked in every time slot. The callback function can include instructions for collecting the value change data, and for storing the value change data so that another processor can access the value change data.

Specifically, the callback function may use a library function to collect value change data. Next, the callback function may store the value change data in a shared memory segment that is accessible by another processor which is executing a value change dump module. The value change dump module on the other processor can then read the value change data and process it accordingly, e.g., the value change dump module may compress the value change data and store the compressed value change data in a computer-readable storage medium for subsequent analysis.

After compilation, the system can execute the simulation kernel on a first processor, thereby causing the first processor to generate value change data which represents changes in a set of signal values, and store the value change data so that a second processor, which is different from the first processor, is able to access the value change data (step 602).

The system can execute the VCD module on the second processor, thereby causing the second processor to compress the value change data, and store the compressed value change data in the computer-readable storage medium for subsequent analysis (step 604). The simulation kernel and the VCD module can execute as separate processes or as separate threads.

Figure 7:
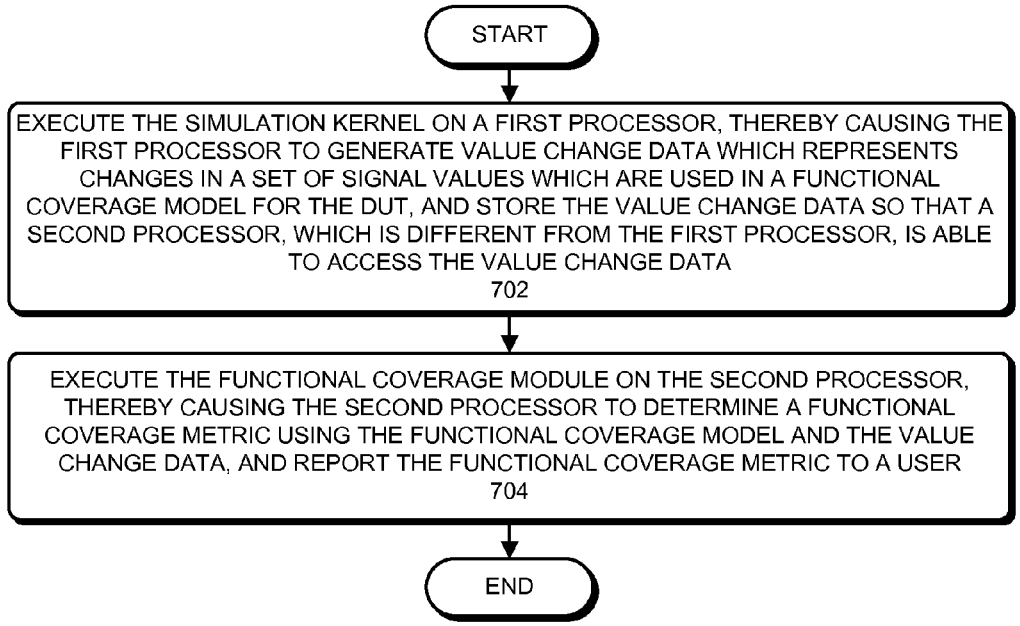
FIG. 7 presents a flowchart that illustrates a process for executing a hardware simulation and verification solution on multiple processors which includes a simulation kernel and a functional coverage module in accordance with an embodiment of the present invention.

FIG. 7 presents a flowchart that illustrates a process for executing a hardware simulation and verification solution on multiple processors which includes a simulation kernel to simulate changes in signal values, and a functional coverage module to check coverage for a DUT in accordance with an embodiment of the present invention.

During operation, the system can execute the simulation kernel on a first processor, thereby causing the first processor to generate value change data which represents changes in a set of signal values which are used in a functional coverage model for the DUT, and store the value change data so that a second processor, which is different from the first processor, is able to access the value change data (step 702).

The system can execute the functional coverage module on the second processor, thereby causing the second processor to determine a functional coverage metric using the functional coverage model and the value change data, and report the functional coverage metric to a user (step 704). The simulation kernel and the functional coverage module can execute as separate processes or as separate threads.

Figure 8:
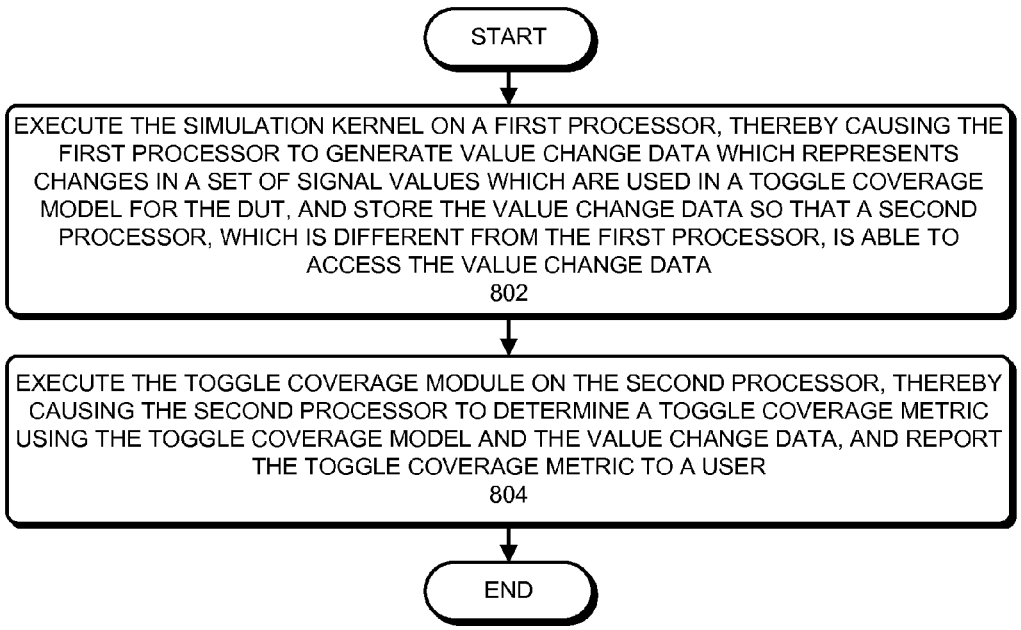
FIG. 8 presents a flowchart that illustrates a process for executing a hardware simulation and verification solution on multiple processors which includes a simulation kernel and a toggle coverage module in accordance with an embodiment of the present invention.

FIG. 8 presents a flowchart that illustrates a process for executing a hardware simulation and verification solution on multiple processors which includes a simulation kernel to simulate changes in signal values, and a toggle coverage module to check signal toggling for a DUT in accordance with an embodiment of the present invention.

During operation, the system can execute the simulation kernel on a first processor, thereby causing the first processor to generate value change data which represents changes in a set of signal values which are used in a toggle coverage model for the DUT, and store the value change data so that a second processor, which is different from the first processor, is able to access the value change data (step 802).

The system can execute the toggle coverage module on the second processor, thereby causing the second processor to determine a toggle coverage metric using the toggle coverage model and the value change data, and report the toggle coverage metric to a user (step 804). The simulation kernel and the toggle coverage module can execute as separate processes or as separate threads.

Figure 9:
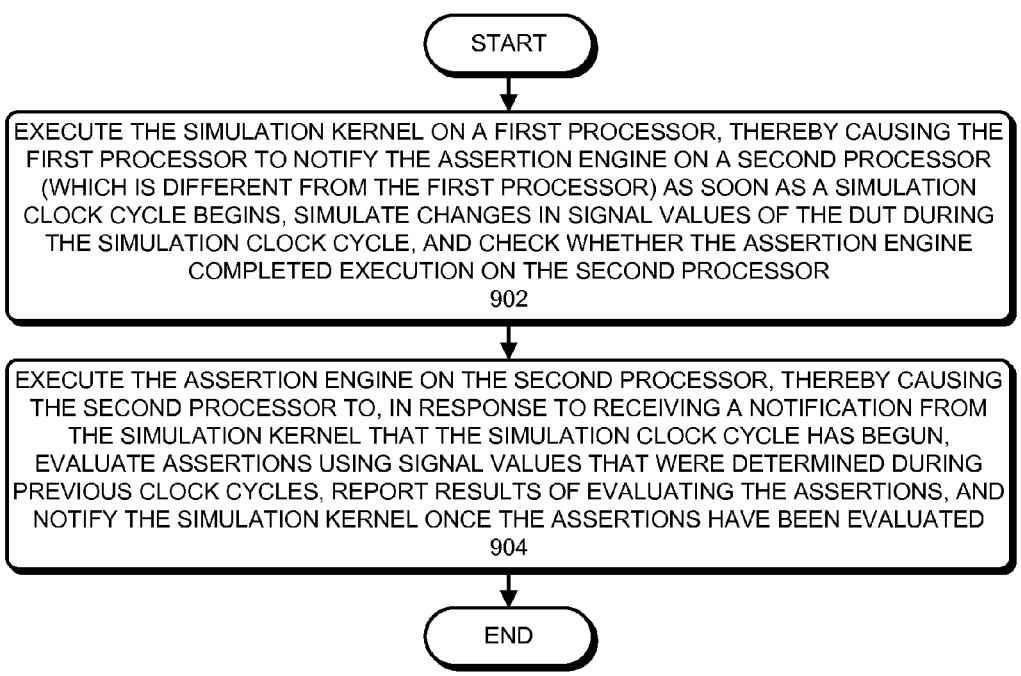
FIG. 9 presents a flowchart that illustrates a process for executing a hardware simulation and verification solution on multiple processors which includes a simulation kernel and an assertion engine in accordance with an embodiment of the present invention.

FIG. 9 presents a flowchart that illustrates a process for executing a hardware simulation and verification solution on multiple processors which includes a simulation kernel to simulate changes in signal values, and an assertion engine to check complex behaviors for a design under test DUT in accordance with an embodiment of the present invention.

During operation, the system can execute the simulation kernel on a first processor, thereby causing the first processor to notify the assertion engine on a second processor (which is different from the first processor) as soon as a simulation time slot begins, simulate changes in signal values of the DUT during the simulation time slot, and check whether the assertion engine completed execution on the second processor (step 902).

The system can execute the assertion engine on the second processor, thereby causing the second processor to, in response to receiving a notification from the simulation kernel that the simulation time slot has begun, evaluate assertions using signal values that were determined during previous time slots, report results of evaluating the assertions, and notify the simulation kernel once the assertions have been evaluated (step 904). The simulation kernel and the assertion engine can execute as separate processes or as separate threads.

In one embodiment, the system does not use the kernel's callback interface to install a callback function that notifies the assertion engine of the beginning of a simulation time slot. Instead, the compiler may generate instructions to notify the assertion engine on the second processor that the simulation time slot has begun. Specifically, these instructions can be part of the simulation kernel's code, and these instructions may be executed by the first processor at the beginning of each simulation time slot, thereby causing the first processor to notify the assertion engine thread on the second processor that the simulation time slot has begun.

Figure 10:
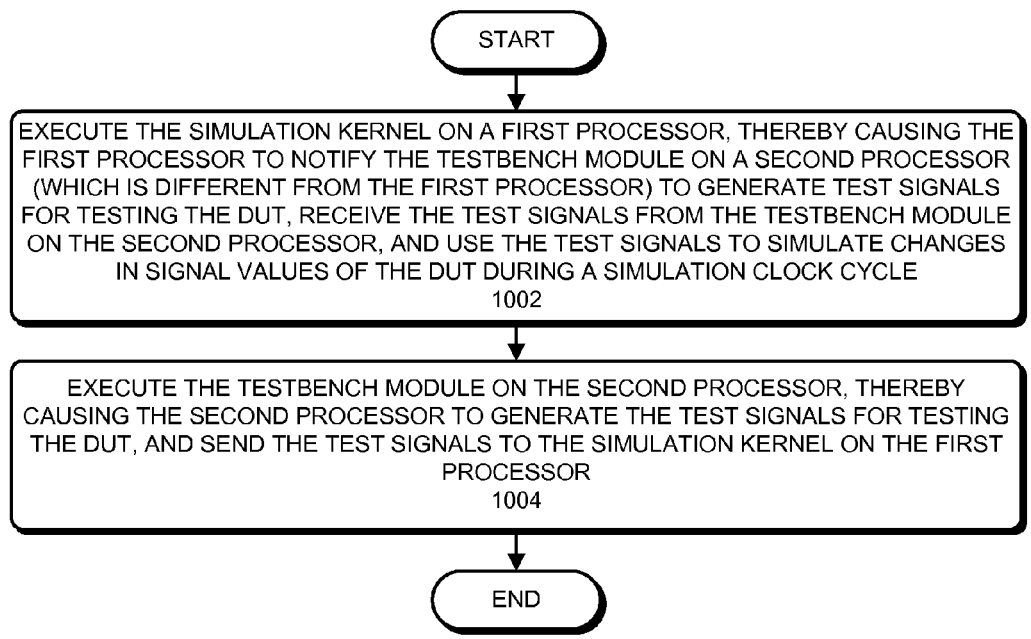
FIG. 10 presents a flowchart that illustrates a process for executing a hardware simulation and verification solution on multiple processors which includes a simulation kernel and a testbench module in accordance with an embodiment of the present invention.

FIG. 10 presents a flowchart that illustrates a process for executing a hardware simulation and verification solution on multiple processors which includes a simulation kernel to simulate changes in signal values, and a testbench module to generate test scenarios for a DUT in accordance with an embodiment of the present invention.

During operation, the system can execute the simulation kernel on a first processor, thereby causing the first processor to notify the testbench module on a second processor (which is different from the first processor) to generate test signals for testing the DUT, receive the test signals from the testbench module on the second processor, and use the test signals to simulate changes in signal values of the DUT during a simulation time slot (step 1002).

The system can execute the testbench module on the second processor, thereby causing the second processor to generate the test signals for testing the DUT, and send the test signals to the simulation kernel on the first processor (step 1004). The simulation kernel and the testbench module can execute as separate processes or as separate threads.

In one embodiment, the compiler may generate instructions to notify the testbench module on the second processor to generate test signals for testing the DUT. These instructions can be part of the simulation kernel's code, and these instructions may be executed by the first processor before the beginning of a simulation time slot, thereby causing the first processor to notify the testbench module to generate the test signals for testing the DUT during the simulation time slot.

CONCLUSION

The data structures and code described in this detailed description are typically stored on a computer-readable storage medium, which may be any device or medium that can store code and/or data for use by a computer system.

This includes, but is not limited to, volatile memory, non-volatile memory, magnetic and optical storage devices such as disk drives, magnetic tape, CDs (compact discs), DVDs (digital versatile discs or digital video discs), or other media capable of storing computer readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for executing a hardware simulation and verification solution which includes a simulation kernel to simulate changes in signal values, and a functional coverage module to check coverage for a design under test (DUT), the method comprising:
   executing the simulation kernel on first processing circuitry, thereby causing the first processing circuitry to:
      generate value change data which represents changes in a set of signal values which are used in a functional coverage model for the DUT; and
      store the value change data so that second processing circuitry, which is different from the first processing circuitry, is able to access the value change data;
   executing the functional coverage module on the second processing circuitry, thereby causing the second processing circuitry to:
      determine a functional coverage metric based on the functional coverage model and the value change data; and
      report the functional coverage metric to a user; and
   wherein source files which describe the DUT are compiled to obtain the simulation kernel, wherein the simulation kernel exposes a callback interface which is used to install callback functions which are invoked when specific events occur, wherein compiling the source files includes installing a first callback function which is invoked whenever the simulation kernel generates the value change data, and wherein the first callback function includes instructions for collecting the value change data and instructions for storing the value change data so that the second processing circuitry can access the value change data.

2. The method of claim 1, wherein the source files describe the DUT based on a standardized, non-proprietary hardware description language (HDL), and wherein the simulation kernel and the functional coverage module execute in separate processes.

3. The method of claim 1, wherein the first and second processing circuitries are different cores of a processor chip.

4. The method of claim 1, wherein the first and second processing circuitries are different processors of a multiprocessor system.

5. A non-transitory computer-readable storage medium storing instructions that, when executed by an apparatus having first and second processing circuitries, cause the apparatus to perform a method for executing a hardware simulation and verification solution which includes a simulation kernel to simulate changes in signal values, and a functional coverage module to check coverage for a design under test (DUT), the method comprising:
   executing the simulation kernel on the first processing circuitry, thereby causing the first processing circuitry to:
      generate value change data which represents changes in a set of signal values which are used in a functional coverage model for the DUT; and
      store the value change data so that the second processing circuitry, which is different from the first processing circuitry, is able to access the value change data;
   executing the functional coverage module on the second processing circuitry, thereby causing the second processing circuitry to:
      determine a functional coverage metric based on the functional coverage model and the value change data; and
      report the functional coverage metric to a user; and
   wherein source files which describe the DUT are compiled to obtain the simulation kernel, wherein the simulation kernel exposes a callback interface which is used to install callback functions which are invoked when specific events occur, wherein compiling the source files includes installing a first callback function which is invoked whenever the simulation kernel generates the value change data, and wherein the first callback function includes instructions for collecting the value change data and instructions for storing the value change data so that the second processing circuitry can access the value change data.

6. The non-transitory computer-readable storage medium of claim 5, wherein the source files describe the DUT based on a standardized, non-proprietary hardware description language (HDL), and wherein the simulation kernel and the functional coverage module execute in separate processes.

7. The non-transitory computer-readable storage medium of claim 5, wherein the first and second processing circuitries are different cores of a processor chip.

8. The non-transitory computer-readable storage medium of claim 5, wherein the first and second processing circuitries are different processors of a multiprocessor system.

9. An apparatus, comprising:
   two or more processing circuitries;
   a storage medium storing instructions that, when executed by the two or more processing circuitries, cause the apparatus to perform a method for executing a hardware simulation and verification solution which includes a simulation kernel to simulate changes in signal values, and a functional coverage module to check coverage for a design under test (DUT), the method comprising:
      executing the simulation kernel on first processing circuitry, thereby causing the first processing circuitry to generate value change data which represents changes in a set of signal values which are used in a functional coverage model for the DUT, and store the value change data so that second processing circuitry, which is different from the first processing circuitry, is able to access the value change data; and
      executing the functional coverage module on the second processing circuitry, thereby causing the second processing circuitry to determine a functional coverage metric based on the functional coverage model and the value change data, and report the functional coverage metric to a user; and
   wherein source files which describe the DUT are compiled to obtain the simulation kernel, wherein the simulation kernel exposes a callback interface which is used to install callback functions which are invoked when specific events occur, wherein compiling the source files includes installing a first callback function which is invoked whenever the simulation kernel generates the value change data, and wherein the first callback function includes instructions for collecting the value change data and instructions for storing the value change data so that the second processing circuitry can access the value change data.

10. The apparatus of claim 9, wherein the source files describe the DUT based on a standardized, non-proprietary hardware description language (HDL), and wherein the simulation kernel and the functional coverage module execute in separate processes.

11. The apparatus of claim 9, wherein the first and second processing circuitries are different cores of a processor chip.

12. The apparatus of claim 9, wherein the first and second processing circuitries are different processors of a multiprocessor system.

* * * * *